United States Patent
Yamaguchi et al.

(10) Patent No.: US 9,668,345 B2
(45) Date of Patent: May 30, 2017

(54) MULTILAYER WIRING BOARD WITH METAL FOIL WIRING LAYER, WIRE WIRING LAYER, AND INTERLAYER CONDUCTION HOLE

(71) Applicant: HITACHI CHEMICAL COMPANY, LTD., Tokyo (JP)

(72) Inventors: Hiroyuki Yamaguchi, Chikusei (JP); Seiichi Kurihara, Chikusei (JP); Hiroshi Sakurai, Chikusei (JP); Shunsuke Nukina, Chikusei (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 60 days.

(21) Appl. No.: 14/389,387

(22) PCT Filed: Mar. 27, 2013

(86) PCT No.: PCT/JP2013/059111
§ 371 (c)(1),
(2) Date: Sep. 30, 2014

(87) PCT Pub. No.: WO2013/146931
PCT Pub. Date: Oct. 3, 2013

(65) Prior Publication Data
US 2015/0075843 A1    Mar. 19, 2015

(30) Foreign Application Priority Data

Mar. 30, 2012 (JP) .................................. 2012-080082
Sep. 28, 2012 (JP) .................................. 2012-216535

(51) Int. Cl.
*H05K 1/11* (2006.01)
*H05K 1/02* (2006.01)
(Continued)

(52) U.S. Cl.
CPC ........... *H05K 1/116* (2013.01); *H05K 1/0251* (2013.01); *H05K 1/0298* (2013.01); *H05K 1/115* (2013.01);
(Continued)

(58) Field of Classification Search
None
See application file for complete search history.

(56) References Cited

U.S. PATENT DOCUMENTS 3,646,572 A * 2/1972 Burr .......................... H05K 7/06
174/251
3,753,046 A * 8/1973 Towell ................... H05K 3/222
174/251
(Continued)

FOREIGN PATENT DOCUMENTS

CN     1329812 A    1/2002
JP    S 62-295491   12/1987
(Continued)

OTHER PUBLICATIONS

International Search Report of Appln. No. PCT/JP2013/059111 dated Jun. 4, 2013 in English.
(Continued)

Primary Examiner — Jeremy C Norris
Assistant Examiner — Muhammed Azam
(74) Attorney, Agent, or Firm — Fitch, Even, Tabin & Flannery, LLP

(57) ABSTRACT

A multilayer wiring board includes a first metal foil wiring layer that has at least two or more layers of metal foil wiring lines and is arranged on a mounting surface side for mounting a surface mount type component, a wire wiring layer that is arranged on an opposite side of the mounting surface, and in which an insulation coating wire is wired, and a first interlayer conduction hole that has a conduction part which
(Continued)

electrically connects the metal foil wiring line positioned on a surface of the first metal foil wiring layer to at least one of the metal foil wiring line in an inner layer of the first metal foil wiring layer and the insulation coating wire of the wire wiring layer. A hole diameter of the first interlayer conduction hole varies in a board thickness direction of the multilayer wiring board.

10 Claims, 9 Drawing Sheets

(51) Int. Cl.
  *H05K 3/42* (2006.01)
  *H05K 3/46* (2006.01)
  *H05K 3/00* (2006.01)

(52) U.S. Cl.
  CPC ......... *H05K 1/0216* (2013.01); *H05K 1/0218* (2013.01); *H05K 3/0047* (2013.01); *H05K 3/429* (2013.01); *H05K 3/4611* (2013.01); *H05K 2201/0154* (2013.01); *H05K 2201/0959* (2013.01); *H05K 2201/09509* (2013.01); *H05K 2201/09518* (2013.01); *H05K 2201/09545* (2013.01); *H05K 2201/09854* (2013.01); *H05K 2201/10287* (2013.01); *H05K 2203/061* (2013.01); *H05K 2203/1572* (2013.01)

(56) References Cited

U.S. PATENT DOCUMENTS

| | | | | |
|---|---|---|---|---|
| 4,219,927 A * | 9/1980 | Fukutomi | ............... | B41J 2/395 174/251 |
| 4,446,191 A * | 5/1984 | Miyadera | ............... | B29C 70/08 428/457 |
| 4,510,008 A * | 4/1985 | Hoshi | ............... | B29C 31/04 156/245 |
| 4,526,838 A * | 7/1985 | Fujioka | ............... | B32B 15/08 428/458 |
| 4,544,801 A * | 10/1985 | Rudik | ............... | C09J 163/10 174/251 |
| 4,646,436 A * | 3/1987 | Crowell | ............... | H01P 11/003 174/251 |
| 5,038,252 A | 8/1991 | Johnson | | |
| 5,045,381 A * | 9/1991 | Suzuki | ............... | C08G 18/092 156/60 |
| 5,315,072 A * | 5/1994 | Arai | ............... | H05K 1/113 174/250 |
| 5,486,655 A * | 1/1996 | Arike | ............... | C08G 59/027 174/251 |
| 6,181,219 B1 * | 1/2001 | Gailus | ............... | H05K 1/024 174/262 |
| 6,284,353 B1 * | 9/2001 | Takada | ............... | H01L 23/49816 174/255 |
| 6,572,968 B2 * | 6/2003 | Takano | ............... | B32B 27/04 428/391 |
| 8,097,545 B2 * | 1/2012 | Amou | ............... | B32B 5/02 428/476.9 |
| 8,735,741 B2 * | 5/2014 | Harazono | ............... | H05K 1/0366 174/261 |
| 2002/0004982 A1 * | 1/2002 | Haze | ............... | H05K 3/385 29/852 |
| 2002/0096358 A1 * | 7/2002 | Murakami | ............ | H01B 11/1091 174/251 |
| 2002/0180027 A1 * | 12/2002 | Yamaguchi | ............ | H01L 21/486 257/700 |
| 2003/0070839 A1 * | 4/2003 | Boyko | ............... | H01L 23/49827 174/262 |
| 2003/0173676 A1 * | 9/2003 | Horikawa | ........... | H01L 23/49816 257/758 |
| 2003/0215619 A1 * | 11/2003 | Ooi | ............... | H05K 3/429 428/209 |
| 2004/0067347 A1 * | 4/2004 | Curcio | ............... | H01L 21/486 428/209 |
| 2004/0080052 A1 * | 4/2004 | Ou | ............... | H01L 23/49827 257/774 |
| 2004/0118596 A1 * | 6/2004 | Fuller, Jr. | ............... | H05K 3/462 174/255 |
| 2004/0211594 A1 * | 10/2004 | Ho | ............... | H01L 23/49816 174/264 |
| 2006/0065434 A1 * | 3/2006 | Hsu | ............... | H05K 1/0216 174/255 |
| 2007/0269588 A1 * | 11/2007 | Lee | ............... | H05K 3/0035 427/97.2 |
| 2007/0289773 A1 * | 12/2007 | Caletka | ............... | H05K 1/0219 174/262 |
| 2008/0011507 A1 * | 1/2008 | Vasoya | ............... | H05K 1/0313 174/260 |
| 2008/0160252 A1 | 7/2008 | Leon et al. | | |
| 2009/0007425 A1 * | 1/2009 | Shinada | ............... | H05K 3/4614 29/843 |
| 2009/0015354 A1 * | 1/2009 | Kim | ............... | H01P 1/2005 333/247 |
| 2009/0038835 A1 * | 2/2009 | Tanaka | ............... | H05K 1/162 174/260 |
| 2011/0061912 A1 * | 3/2011 | Kang | ............... | H05K 3/4611 174/258 |
| 2011/0180908 A1 * | 7/2011 | Naganuma | ........ | H01L 23/49838 257/621 |
| 2012/0235141 A1 * | 9/2012 | Masubuchi | ............ | H05K 1/0271 257/48 |
| 2013/0056246 A1 * | 3/2013 | Laurencot | ............... | H05B 3/84 174/251 |
| 2013/0077813 A1 * | 3/2013 | Minoo | ............... | H05K 1/183 381/369 |
| 2014/0041903 A1 * | 2/2014 | Wang | ............... | H05K 1/0298 174/251 |
| 2014/0069693 A1 * | 3/2014 | Zahr | ............... | H05K 3/103 174/251 |

FOREIGN PATENT DOCUMENTS

| | | |
|---|---|---|
| JP | 05-110260 | 4/1993 |
| JP | 11-289025 | 10/1999 |
| JP | 2001-339157 | 12/2001 |
| JP | 2002-335079 | 11/2002 |
| JP | 2004-342978 | 12/2004 |
| JP | 2010-045284 | 2/2010 |
| JP | 2011-198827 | 10/2011 |
| TW | 200708215 A | 2/2007 |

OTHER PUBLICATIONS

International Preliminary Report on Patentability of Appln. No. PCT/JP2013/059111 dated Oct. 9, 2014 in English.

Office Action in counterpart TW Patent Application No. 102111458 dated Oct. 25, 2016.

* cited by examiner

MULTILAYER WIRING BOARD WITH METAL FOIL WIRING LAYER, WIRE WIRING LAYER, AND INTERLAYER CONDUCTION HOLE

TECHNICAL FIELD

The present invention relates to a multilayer wiring board, and in particular, relates to a multilayer wiring board for mounting surface mount type components.

BACKGROUND ART

In recent years, as electronic devices become highly functional, increase of a wiring housing amount is strongly demanded together with improvement of wiring density for a multilayer wiring board. In order to satisfy the demand, in the multilayer wiring board, the wiring housing amount has been increased by narrowing of a wiring width or high multilayering by increase of the number of wiring layers.

Also, as the multilayer wiring board that responds to the demand for wiring housing amount increase, there is a multi-wire wiring board for which a wiring pattern is formed of insulation coating wires (Patent Literature 1). According to the multi-wire wiring board, since the wiring pattern formed of the insulation coating wires is used, intersecting wiring within the same wiring layer is made possible, and the wiring housing amount can be increased without increasing the number of wiring layers.

In the meantime, in surface mount type components mounted on the multilayer wiring board, pitch narrowing has been advanced. In order to cope with the pitch narrowing, there is proposed a multilayer wiring board (Patent Literature 2) for which an interlayer conduction hole is formed right below a surface mount pad of the multilayer wiring board, and which is connected to an inner layer circuit through the interlayer conduction hole, or a multilayer wiring board (Patent Literature 3) for which a fan-out wiring line pulled out and wired from the surface mount pad is provided in an inner layer and connected to the interlayer conduction hole.

Also, there is proposed a multilayer wiring board including an interlayer conduction hole composed of a large hole diameter part of a relatively large hole diameter, formed from one substrate surface for mounting the surface mount type components to an inner layer, and a small hole diameter part of a relatively small hole diameter, formed from the inner layer to the other substrate surface (Patent Literature 4).

CITATION LIST

Patent Literature

Patent Literature 1: Japanese Patent Application Laid-Open Publication No. 2010-045284

Patent Literature 2: Japanese Patent Application Laid-Open Publication No. H05-110260

Patent Literature 3: Japanese Patent Application Laid-Open Publication No. H11-289025

Patent Literature 4: Japanese Patent Application Laid-Open Publication No. 2011-198827

SUMMARY OF INVENTION

Technical Problem

As described above, in recent years, there is a need to cope with an increasing wiring housing amount and also to cope with the pitch narrowing of surface mount type components.

However, in a multi-wire wiring board disclosed in Patent Literature 1, though it is possible to cope with the wiring housing amount, for instance, there is a problem that it is difficult to cope with the surface mount type component for which a connection terminal is at a narrow pitch equal to or smaller than 0.5 mm pitch. That is, in the multi-wire wiring board, since the wiring pattern is formed of the insulation coating wires, it is difficult to micronize a wiring width and an interlayer conduction hole, compared to a general multilayer wiring board for which a wiring line is formed by etching copper foil or plating or the like. Therefore, in order to cope with the surface mount type component for which the connection terminal is at the narrow pitch equal to or smaller than 0.5 mm pitch, the interlayer conduction hole to be formed right below the surface mount pad of the multilayer wiring board is also at the 0.5 mm pitch or smaller, so that it becomes difficult to form the interlayer conduction hole.

Also, in the multilayer wiring board disclosed in Patent Literatures 2 and 3, though it is advantageous for coping with the pitch narrowing of the surface mount type components and forming the fan-out wiring line, there is the problem that the wiring housing amount per wiring layer is insufficient. That is, while it is needed to narrow the wiring width of the wiring line to be arranged between the interlayer conduction holes right below the surface mount pad accompanying the pitch narrowing of the surface mount type component, it is needed to carry out pitch conversion and impedance matching and the like for fanned-out wiring line in order to connect the multilayer wiring board mounted with the surface mount type component to another substrate such as a motherboard, and the wiring width needs to be secured for that. As a result, the wiring housing amount per wiring layer declines, the need to multilayer the wiring layer further occurs, so that drilling work and plating formation of a high aspect ratio (a high board thickness and a small diameter hole) are needed, and there is the problem that it is difficult to form the interlayer conduction hole. In particular, in the case of mounting a BGA (Ball Grid Array) component or the like where many continuous holes at the narrow pitch are arranged, since the interlayer conduction hole is at the narrow pitch and a fanned-out wiring amount is large, the number of wiring layers for the pitch conversion and the impedance matching and the like increases, and there is the problem that the aspect ratio of the interlayer conduction hole becomes high.

In the multilayer wiring board disclosed in Patent Literature 4, the side of mounting the surface mount type component of the multilayer wiring board is a hole diameter large part where a hole diameter is relatively larger than the opposite side. Therefore, for instance, in the case of the surface mount type component for which the pitch of the connection terminal of the surface mount type component is the narrow pitch equal to or smaller than 0.5 mm (hereinafter, may be simply called "narrow pitch"), even the hole diameter large part on the side of mounting the surface mount type component of the multilayer wiring board is worked with a small-diameter drill of a diameter equal to or smaller than 0.2 mm and the hole diameter on the opposite side is worked with a drill of a smaller diameter, so that the drilling work and plating formation of a high aspect ratio (a high board thickness and a small diameter hole) are needed, and there is the problem that it is difficult to form the interlayer conduction hole.

In such a manner, in addition to the fact that it is needed to multilayer the wiring layer in order to cope with the increase of the wiring housing amount, it is needed to narrow the pitch of the interlayer conduction hole arranged right below the surface mount pad in order to cope with the pitch narrowing of the surface mount type component. When the interlayer conduction hole pitch is narrowed, the wiring housing amount per wiring layer is reduced because of limitation of the wiring width, further multilayering is needed, and since a plate thickness increases, in the formation of the interlayer conduction hole, there is the problem with drilling work and plating throwing power (Throwing Power: a plating thickness at a through-hole center part/thickness at the entrance×100%).

The present invention is implemented in view of the above, and it is an object to provide a multilayer wiring board which allows mounting of the surface mount type component at the narrow pitch, and for which the wiring housing amount is increased.

Solution to Problem

A multilayer wiring board according to the present invention comprises a first metal foil wiring layer that has at least two or more layers of metal foil wiring lines and is arranged on a mounting surface side for mounting a surface mount type component, a wire wiring layer that is arranged on an opposite side of the mounting surface, and in which an insulation coating wire is wired, and a first interlayer conduction hole that has a conduction part which electrically connects the metal foil wiring line positioned on a surface of the first metal foil wiring layer to at least one of the metal foil wiring line in an inner layer of the first metal foil wiring layer and the insulation coating wire of the wire wiring layer, and in the multilayer wiring board, wherein a hole diameter of the first interlayer conduction hole varies in a board thickness direction of the multilayer wiring board.

Also, in the multilayer wiring board, the first interlayer conduction hole may include a small diameter hole part that is positioned on the first metal foil wiring layer side of the multilayer wiring board, and a large diameter hole part that is positioned on the wire wiring layer side and has a hole diameter larger than the small diameter hole part.

Also, the multilayer wiring board may further comprise a second interlayer conduction hole that is positioned on the first metal foil wiring layer side and is formed at a position different from the first interlayer conduction hole, wherein the first interlayer conduction hole may be a through conduction hole passing through the multilayer wiring board, and the second interlayer conduction hole may be a non-through conduction hole not passing through the multilayer wiring board. In this case, the first interlayer conduction hole and the second interlayer conduction hole may be alternately arranged.

Also, in the multilayer wiring board, the number of the metal foil wiring lines arranged in a gap of the first and second interlayer conduction holes and the number of the insulation coating wires arranged in a gap of the first interlayer conduction holes with each other may be different, and a width of the metal foil wiring line arranged in the gap of the first and second interlayer conduction holes and a diameter of the insulation coating wire arranged in the gap of the first interlayer conduction holes with each other may be different.

Also, the multilayer wiring board may further comprise a second metal foil wiring layer that is arranged on the opposite side of the mounting surface side of the wire wiring layer and has at least two or more layers of metal foil wiring lines. In this case, a prepreg used for multilayering adhesion of the first metal foil wiring layer arranged on the mounting surface side of the wire wiring layer and a prepreg used for multilayering adhesion of the second metal foil wiring layer may be different kinds.

Advantageous Effects of Invention

The present invention makes it possible to provide a multilayer wiring board which allows mounting of the surface mount type component at the narrow pitch, and for which the wiring housing amount is increased.

DESCRIPTION OF EMBODIMENTS

First Embodiment

Figure 1:
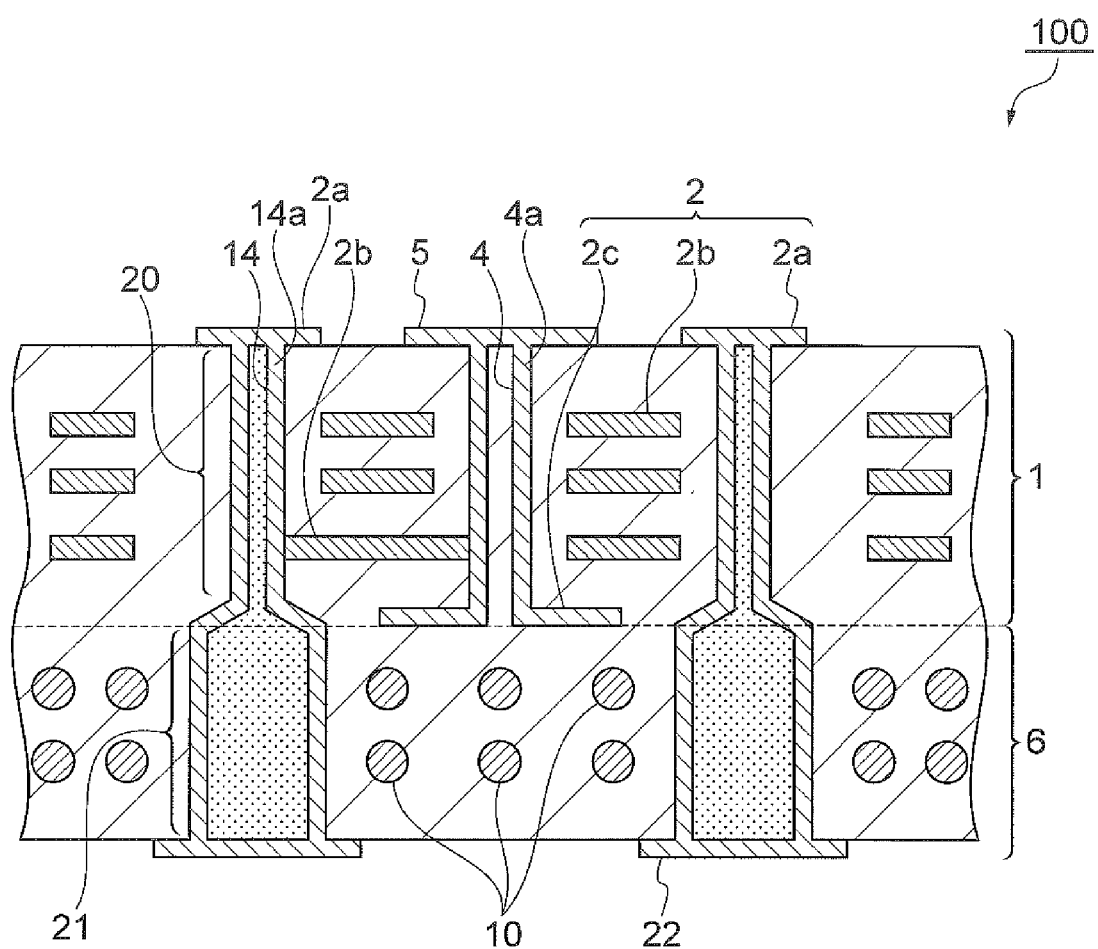
FIG. 1 is a section view illustrating an outline of a structure of a multilayer wiring board in a first embodiment of the present invention.

FIG. 1 is a section view illustrating an outline of a structure of a multilayer wiring board in a first embodiment. A multilayer wiring board 100 in the present embodiment includes, as illustrated in FIG. 1, a first metal foil wiring layer 1, a wire wiring layer 6, and interlayer conduction holes 4 and 14 (a through conduction hole 14 and a non-through conduction hole 4). The first metal foil wiring layer 1 has two or more layers of metal foil wiring lines 2 (2a-2c), and is arranged on the side of a mounting surface 5 for mounting surface mount type components in the multilayer wiring board 100. The wire wiring layer 6 is the layer where a plurality of insulation coating wires 10 are wired in a spreading direction of the layer, and is arranged on the opposite side of the mounting surface 5 (first metal foil wiring layer 1) in the multilayer wiring board 100. The interlayer conduction hole 14 is a through conduction hole including a conduction part 14a that electrically connects the metal foil wiring line 2a on a surface of the first metal foil wiring layer 1 to at least one of the metal foil wiring line 2b in an inner layer of the first metal foil wiring layer 1 and the insulation coating wire 10 of the wire wiring layer 6. The interlayer conduction hole 4 is a non-through conduction hole including a conduction part 4a that electrically connects the metal foil wiring line 2a on the surface of the first metal foil wiring layer 1 with the metal foil wiring line 2b in the inner layer of the first metal foil wiring layer 1. A hole diameter of the interlayer conduction hole 14 varies in a board thickness direction of the multilayer wiring board 100. On the other hand, a hole diameter of the interlayer conduction hole 4 is fixed in the board thickness direction of the multilayer wiring board 100.

The surface mount type component to be mounted on the surface of the multilayer wiring board 100 is a component not to be attached by inserting an electrode of the component to a component attaching hole provided on the multilayer wiring board but to be directly loaded on an electrode provided on the surface of the multilayer wiring board 100 by soldering or the like. Examples of the surface mount type component include, for instance, multifunctional surface mount type components such as a BGA (Ball Grid Array), CSP (Chip Size Package), TAB (Tape Automated Bonding) or MCM (Multi Chip Module). The mounting surface 5 is the surface of the multilayer wiring board 100 on the side where the surface mount type component is to be mounted.

The metal foil wiring line is a wiring line formed by carrying out etching or the like to metal foil or plating for instance. For the metal foil and the plating, the ones generally used in the multilayer wiring board can be used. Examples of the metal foil include, for instance, copper foil, aluminum foil, nickel foil, or solder foil, and examples of the plating include, for instance, copper plating, nickel plating, gold plating, or silver plating. Also, the metal foil wiring layer is the wiring layer configured including an insulating layer, and the metal foil wiring line formed of the metal foil wiring line on the insulating layer, and is the wiring layer including only the metal foil wiring line and not including the insulation coating wire on the insulating layer. For instance, it can be formed by etching the metal foil and the plating formed thereon of a metal-foiled laminate for which the metal foil is stuck on an insulating resin, to be generally used for the multilayer wiring board. The metal foil wiring layer can be multilayered by laminating the plurality of layers through the insulating layer. Also, by fainting the through conduction hole and the non-through conduction hole, the interlayer conduction hole can be formed.

The insulation coating wire is the wire for which a wire to be a conductor is insulation-coated with an insulating resin or the like. As the wire, copper is used for instance. Also, a wire diameter is a diameter of only the wire excluding the insulating resin that coats the wire. The wire wiring layer is the wiring layer including an insulating layer and wiring lines formed of the insulation coating wires on the insulating layer, and includes the one for which the metal foil wiring line of a shield layer or the like is laminated and integrated through the insulating layer on both surfaces or one surface. For instance, it can be used by wiring the insulation coating wires on an adhesive layer which is the insulating layer by using a wiring device, laminating and integrating the metal foil to be a shield layer through the insulation layer on one surface or both surfaces thereof further, and etching the metal foil to be the shield layer. The wire wiring layer can be multilayered by laminating the plurality of layers through the insulating layer. Also, by forming the through conduction hole and the non-through conduction hole, the interlayer conduction hole can be formed.

The interlayer conduction hole is the one that electrically connects the metal foil wiring lines of the different metal foil wiring layers with each other, the metal foil wiring line of the metal foil wiring layer and the wire of the wire wiring layer, or the wires of the different wire wiring layers with each other, and is the one that electrically connects the wiring layers by forming a conductor in a through-hole or a non-through-hole provided in the multilayer wiring board. The through conduction hole is the interlayer conduction hole that electrically connects the wiring layers by forming the conductor in a hole passing through the multilayer wiring board, and the non-through conduction hole is the interlayer conduction hole that electrically connects the wiring layers by forming the conductor in a hole not passing through the multilayer wiring board. For instance, by opening the through-hole or the non-through hole by using a drill or a laser and then forming the plating or a conductive resin inside the through-hole or the non-through-hole, the wiring layers can be electrically conducted.

The fact that the hole diameter of the interlayer conduction hole varies in the board thickness direction of the multilayer wiring board means that the hole diameter of the same interlayer conduction hole varies in the board thickness direction of the multilayer wiring board. For instance, there is a case that the hole diameter of the through conduction hole (or the non-through conduction hole) is different on the mounting surface side (the side of the first metal foil wiring layer 1) of the multilayer wiring board and the opposite side (the wire wiring layer side) of the mounting surface. For the interlayer conduction hole whose hole diameter varies in the board thickness direction in this way, when it is the through conduction hole, for instance, there is a method of forming a non-through-hole from the mounting surface side of the multilayer wiring board to the middle in the board thickness direction with a drill of a small diameter, then forming a through-hole by working a hole from the opposite side of the mounting surface of the multilayer wiring board to the middle in the board thickness direction with a drill of a diameter larger than the non-through-hole so as to be connected with the non-through-hole, and forming the conductor in the through-hole by plating or the like thereafter. When it is the non-through conduction hole, for instance, there is a method of forming a non-through-hole from the mounting surface side to the middle in the board thickness direction of the first metal foil wiring layer with the drill of the small diameter, to the first metal foil wiring layer before being laminated and integrated with the wire wiring layer, then forming a through-hole by working a hole from the opposite side of the mounting surface of the first metal foil wiring layer to the middle in the board thickness direction with the drill of the diameter larger than the non-through-hole so as to be connected with the non-through-hole, then forming the conductor in the through-hole by plating or the like, and laminating and integrating the first metal foil wiring layer and the wire wiring layer so as to close the through conduction hole thereafter.

As illustrated in FIG. 1, according to the present embodiment, the multilayer wiring board 100 includes the interlayer conduction holes that are the through conduction hole 14 and the non-through conduction hole 4, and the metal foil wiring layer 1 and the wire wiring layer 6 are combined. Therefore, in the multilayer wiring board 100, a narrow-pitch component can be mounted by the metal foil wiring line 2a of a surface layer formed on the side of the mounting surface 5 of the first metal foil wiring layer 1, the first metal foil wiring layer 1 and the wire wiring layer 6 are connected by the through conduction hole 14 and the non-through conduction hole 4, and the wiring housing amount can be increased by the wire wiring layer 6.

That is, as illustrated in FIG. 1, by arranging and combining the first metal foil wiring layer 1 on the side of the mounting surface 5 for mounting the surface mount type component and the wire wiring layer 6 on the opposite side, first, in the first metal foil wiring layer 1 on the side of the mounting surface 5, a fine wiring pattern can be formed, and the fine through conduction hole 14 and the non-through conduction hole 4 can be formed. Therefore, it is possible to form the interlayer conduction hole at the narrow pitch of 0.5 mm or smaller and to arrange a fan-out wiring line between the interlayer conduction holes, and it is also possible to cope with mounting of the surface mount type component at the narrow pitch.

In the meantime, in the wire wiring layer 6 on the opposite side of the mounting surface 5, since the wiring pattern formed by the insulation coating wire 10 is used, intersecting wiring within the same wiring layer is made possible using the insulation coating wire 10 of a wire diameter needed for impedance matching, and the wiring housing amount per wiring layer can be increased while securing conductor resistance. Therefore, the wiring housing amount per wiring layer can be secured even when pitch conversion, impedance matching or the like is carried out for the fanned-out wiring line in order to connect the multilayer wiring board mounted with the surface mount type component to another board such as a motherboard.

Also, since the hole diameter of the through conduction hole 14 varies in the board thickness direction of the multilayer wiring board 100, a small diameter hole part 20 of a small hole diameter can be arranged on the side of the mounting surface 5 of the multilayer wiring board 100 needing the interlayer conduction hole at the narrow pitch, and in this case, it is easy to form the interlayer conduction hole at the narrow pitch of 0.5 mm or smaller. Also, a large diameter hole part 21 of a hole diameter larger than the small diameter hole part 20 can be arranged on the opposite side of the mounting surface 5 of the multilayer wiring board 100, and in this case, even when the multilayer wiring board 100 is thick, increase of an aspect ratio can be suppressed and it is made easy to form the interlayer conduction hole.

As described above, according to the multilayer wiring board 100 of the present embodiment, since the aspect ratio of the interlayer conduction holes 4 and 14 can be lowered without the need of highly multilayering the wiring layer, drilling work of a drill and plating formation become easy. As a result, according to the multilayer wiring board 100, it becomes easy to mount the surface mount type component at the narrow pitch of 0.5 mm or smaller, and the wiring housing amount can be increased.

Also, in the multilayer wiring board 100, it is desirable that the interlayer conduction hole 14 includes the small diameter hole part 20 on the side of the mounting surface 5 (the side of the first metal foil wiring layer 1) of the multilayer wiring board 100 and the large diameter hole part 21 on the opposite side (the side of the wire wiring layer 6) of the mounting surface 5. Since the small diameter hole part 20 of the small hole diameter is arranged on the side of the mounting surface 5 of the multilayer wiring board 100 needing the interlayer conduction hole at the narrow pitch, it becomes easy to form the interlayer conduction hole at the narrow pitch of 0.5 mm or smaller. On the other hand, since the large diameter hole part 21 of the large hole diameter is arranged on the opposite side of the mounting surface 5 of the multilayer wiring board 100, even when the multilayer wiring board 100 is thick, the increase of the aspect ratio can be suppressed and it is made easy to form the interlayer conduction hole.

It is desirable that the multilayer wiring board 100 includes the through conduction hole 14 which is the small diameter hole part 20 on the side of the first metal foil wiring layer 1 and is the large diameter hole part 21 of the diameter larger than the small diameter hole part 20 on the side of the wire wiring layer 6, and the non-through conduction hole 4 provided on the side of the first metal foil wiring layer 1. Thus, in the multilayer wiring board 100, the non-through conduction hole 4 can be arranged in a gap of the through conduction hole 14 and another through conduction hole 14 in an area (the side of the first metal foil wiring layer 1) in the board thickness direction where the diameter of the through conduction hole 14 is the small diameter, and the density (the number of holes per unit area) of the non-through conduction hole 4 and the through conduction hole 14 for the interlayer conduction can be improved. Also, in an area (the side of the wire wiring layer 6) in the board thickness direction where the diameter of the through conduction hole 14 is the large diameter, since the aspect ratio of the through conduction hole 14 is lowered, even when the multilayer wiring board 100 is thick, plating deposition inside the through conduction hole 14 can be secured.

In the multilayer wiring board 100, it is desirable that the small diameter hole part 20 of the through conduction hole 14 and the non-through conduction hole 4 are alternately and adjacently arranged. In such a manner, when the small diameter hole part 20 of the through conduction hole 14 and the non-through conduction hole 4 are adjacently arranged, since the hole diameter of the through conduction hole 14 varies in the board thickness direction of the multilayer wiring board 100, as illustrated in FIG. 1, an arrangement interval (pitch) of the non-through conduction hole 4 and the through conduction hole 14 can be narrowed compared to the pitch of the through conduction hole 14, and the density of the interlayer conduction holes can be increased. Therefore, when the surface mount pad is formed right above the interlayer conduction hole, it is possible to cope with the mounting of the surface mount type component at the narrow pitch equal to or smaller than the 0.5 mm pitch.

It is desirable that the number of the metal foil wiring lines 2 arranged in the gap of the non-through conduction hole 4 and the through conduction hole 14 and the number of the insulation coating wires 10 arranged in the gap of the through conduction hole 14 and another through conduction hole 14 are different. Even in the case of forming a pad for surface mounting at the narrow pitch on the surface of the first metal foil wiring layer 1, arranging the prescribed number of the metal foil wiring lines 2b in the inner layer in the gap of the non-through conduction hole 4 and the through conduction hole 14 of the first metal foil wiring layer 1 and performing fan-out, it is made easy to carry out the impedance matching and the pitch conversion by the insulation coating wires 10 arranged in the gap of the through conduction hole 14 and another through conduction hole 14 of the wire wiring layer 6, and the wiring housing amount can be improved.

Also, in the multilayer wiring board 100, it is desirable that the width of the metal foil wiring line 2 arranged in the gap of the non-through conduction hole 4 and the through conduction hole 14 and the diameter of the insulation coating wire 10 arranged in the gap of the through conduction hole 14 and another through conduction hole 14 are different. Even in the case of forming the pad for surface mounting at the narrow pitch on the surface of the first metal foil wiring layer 1, arranging the metal foil wiring lines 2b of a fine width in the inner layer in the gap of the non-through conduction hole 4 and the through conduction hole 14 of the first metal foil wiring layer 1 and performing fan-out, it is made easy to carry out the impedance matching and the pitch conversion by the insulation coating wires 10 arranged in the gap of the through conduction hole 14 and another through conduction hole 14 of the wire wiring layer 6, and the wiring housing amount can be improved.

Second Embodiment

Figure 6:
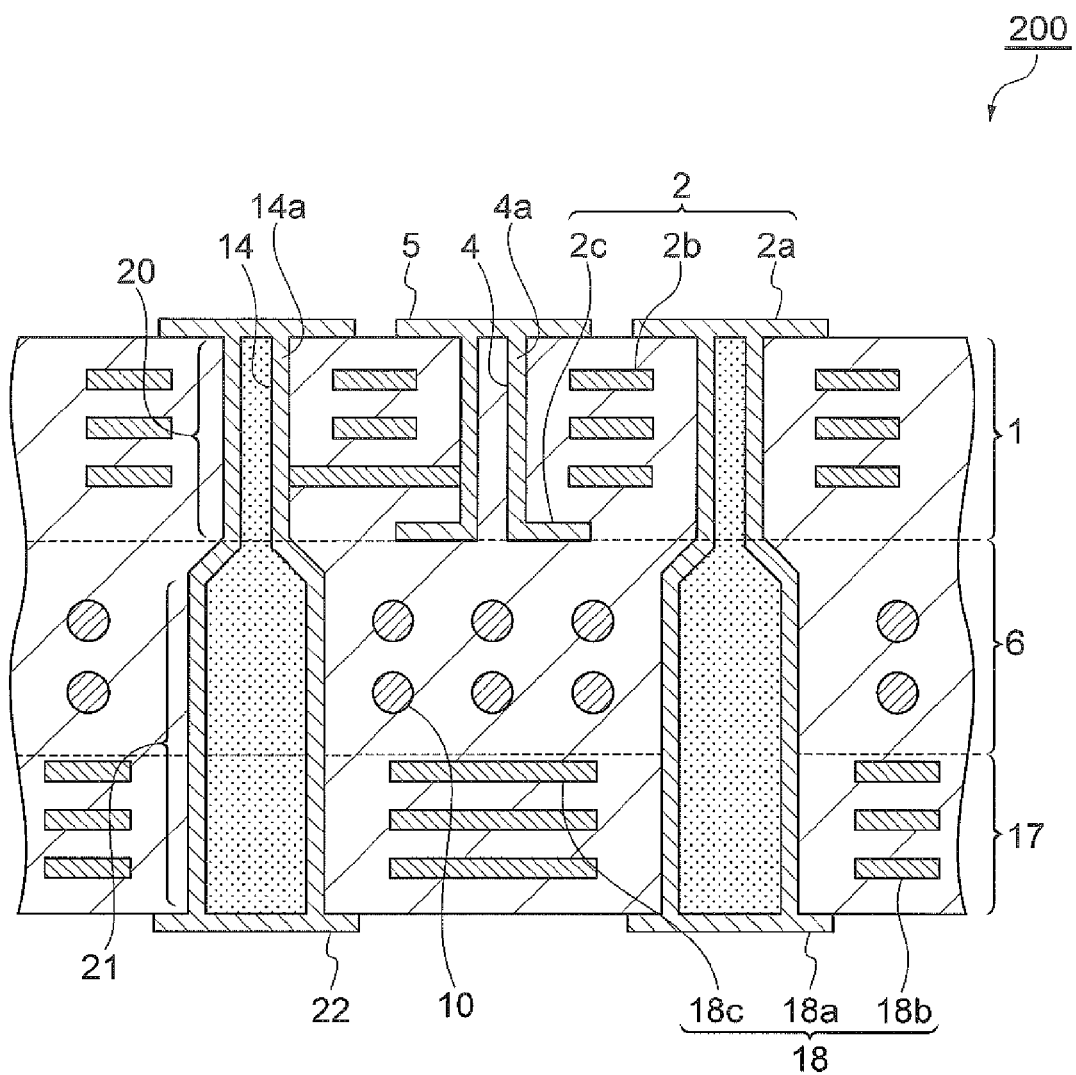
FIG. 6 is a section view illustrating an outline of a structure of the multilayer wiring board in a second embodiment of the present invention.

FIG. 6 is a section view illustrating an outline of a structure of a multilayer wiring board in the second embodiment. A multilayer wiring board 200 in the present embodiment is different in that a plurality of metal foil wiring layers are provided compared to the first embodiment. Specifically, the multilayer wiring board 200 of the present embodiment includes the first metal foil wiring layer 1, the wire wiring layer 6, a second metal foil wiring layer 17, and the interlayer conduction holes 4 and 14 (the through conduction hole 14 and the non-through conduction hole 4). The first metal foil wiring layer 1 has two or more layers of the metal foil wiring lines 2 (2a-2c), and is arranged on the side of the mounting surface 5 for mounting the surface mount type components in the multilayer wiring board 200. The wire wiring layer 6 is the layer where the plurality of insulation coating wires 10 are wired in the spreading direction of the layer, and is arranged on the opposite side of the mounting surface 5 of the first metal foil wiring layer 1 in the multilayer wiring board 200. The second metal foil wiring layer 17 has two or more layers of metal foil wiring lines 18 (18a-18c), and is arranged on the opposite side of the mounting surface 5 in the multilayer wiring board 200. That is, in the multilayer wiring board 200, in a cross-sectional view, the wire wiring layer 6 is interposed between the first and second metal foil wiring layers 1 and 17.

Also, in the multilayer wiring board 200, the interlayer conduction hole 14 is the through conduction hole including the conduction part 14a that electrically connects the metal foil wiring line 2a on the surface of the first metal foil wiring layer 1 to at least one of the metal foil wiring line 2b in the inner layer of the first metal foil wiring layer 1, the insulation coating wire 10 of the wire wiring layer 6 and the metal foil wiring line 18 of the second metal foil wiring layer 17. The through conduction hole 14 may electrically connect the other metal foil wiring lines 2b, 2c of the first metal foil wiring layer 1 or the insulation coating wire 10 of the wire wiring layer 6 and the metal foil wiring line 18 of the second metal foil wiring layer 17. The interlayer conduction hole 4 is the non-through conduction hole including the conduction part 4a that electrically connects the metal foil wiring line 2a on the surface of the first metal foil wiring layer 1 with the metal foil wiring line 2b in the inner layer of the first metal foil wiring layer 1. The hole diameter of the through conduction hole 14 varies in the board thickness direction of the multilayer wiring board 200. On the other hand, the hole diameter of the interlayer conduction hole 4 is fixed in the board thickness direction of the multilayer wiring board 200.

As illustrated in FIG. 6, similarly to the first embodiment, the multilayer wiring board 200 includes the through conduction hole 14 and the non-through conduction hole 4, and the first metal foil wiring layer 1 and the wire wiring layer 6 are combined. Therefore, in the multilayer wiring board 200, narrow pitch component mounting and fan-out are made possible by the metal foil wiring line 2a on the surface formed on the side of the mounting surface 5 of the first metal foil wiring layer 1, the first metal foil wiring layer 1 and the wire wiring layer 6 or the second metal foil wiring layer 17 are connected by the through conduction hole 14 and the non-through conduction hole 4, and the wiring housing amount needed for the impedance matching and the pitch conversion of the wiring lines after the fan-out can be sufficiently secured by the wire wiring layer 6.

Also, in order to mount components at the narrow pitch and secure the wiring housing amount, as illustrated in FIG. 1, a method of laminating and integrating the first metal foil wiring layer 1 and the wire wiring layer 6 by a multilayering adhesive layer (prepreg layer) can be considered. In this case, there is the case of generating a warp due to a difference in cure shrinkages of materials or the like when laminating the first metal foil wiring layer 1 and the wire wiring layer 6. However, as illustrated in FIG. 6, according to the present embodiment, since the first metal foil wiring layer 1 and the second metal foil wiring layer 17 are arranged so as to interpose the wire wiring layer 6 therebetween, even when they are laminated and integrated, the first metal foil wiring layer 1 and the second metal foil wiring layer 17 arranged on both sides of the multilayer wiring board 200 cancel stress of the warp with each other, so that a warp amount can be suppressed.

Also, in the multilayer wiring board 200, it is desirable that a prepreg used for multilayering adhesion of the first metal foil wiring layer 1 arranged on the side of the mounting surface 5 of the wire wiring layer 6 and a prepreg used for multilayering adhesion of the second metal foil wiring layer 17 are different kinds. Thus, the difference in the cure shrinkages can be adjusted, and the effect that the first metal foil wiring layer 1 and the second metal foil wiring layer 17 arranged on both sides of the multilayer wiring board 200 cancel the stress of the warp with each other is improved more.

As illustrated in FIG. 6, in the multilayer wiring board 200, the first metal foil wiring layer 1 and the second metal foil wiring layer 17 are arranged so as to interpose the wire wiring layer 6 therebetween, and the same number of layers is desirable for the metal foil wiring lines 2 of the first metal foil wiring layer 1 and the metal foil wiring lines 18 of the second metal foil wiring layer 17. Thus, since the configuration in the board thickness direction of the multilayer wiring board becomes the same, the warp amount can be reduced.

EXAMPLES

Hereinafter, the present invention will be more specifically described with examples, however, the present invention is not limited to the following examples.

Example 1

Using FIG. 2-FIG. 5, the example 1 of the multilayer wiring board of the present invention will be described. FIG.

2 is a section view illustrating an outline of the first metal foil wiring layer 1 used in the multilayer wiring board in the example 1 of the present invention. As preparation of the first metal foil wiring layer 1, first, on a copper-clad laminate of a polyimide base material (manufactured by Hitachi Chemical Company, Ltd., product name "MCL-I-671 ("MCL" is a registered trademark)") whose plate thickness was 0.1 mm and which had copper foil of thickness being 18 μm, a circuit (metal foil wiring line 2) for which a line width was 70 μm and which had one wiring line at a 0.5 mm pitch, was formed. The plurality of such polyimide base materials were formed. Then, using a polyimide prepreg (manufactured by Hitachi Chemical Company, Ltd., product name "GIA-671N") which was a multilayering adhesive layer, the polyimide base materials were multilayered and laminated, and a multilayered polyimide base material whose plate thickness was 0.9 mm and for which the metal foil wiring lines 2b in the inner layer were in 10 layers (the entire metal foil wiring lines 2 are in 12 layers), was formed.

Then, drilling work was carried out with a drill of a diameter being 0.15 mm at a 1.0 mm pitch to the multilayered polyimide base material, electroless copper plating (thickness is 20 μm) was executed to an inner peripheral surface of the hole (interlayer conduction hole 4) of the multilayered base material, and copper foil (metal foil wiring line 2a) on a base material surface and a required inner layer pattern (the metal foil wiring line 2b in the inner layer) were connected through the conduction part 4a formed on the inner peripheral surface of the hole. Also, a circuit (metal foil wiring line 2c) of the copper foil was formed in the surface layer to be a surface opposite to the side of the surface mounting surface 5 of the multilayered base material, and the copper foil circuit was also connected to the conduction part 4a. Thus, one A substrate to be the first metal foil wiring layer 1 was manufactured.

Figure 3:
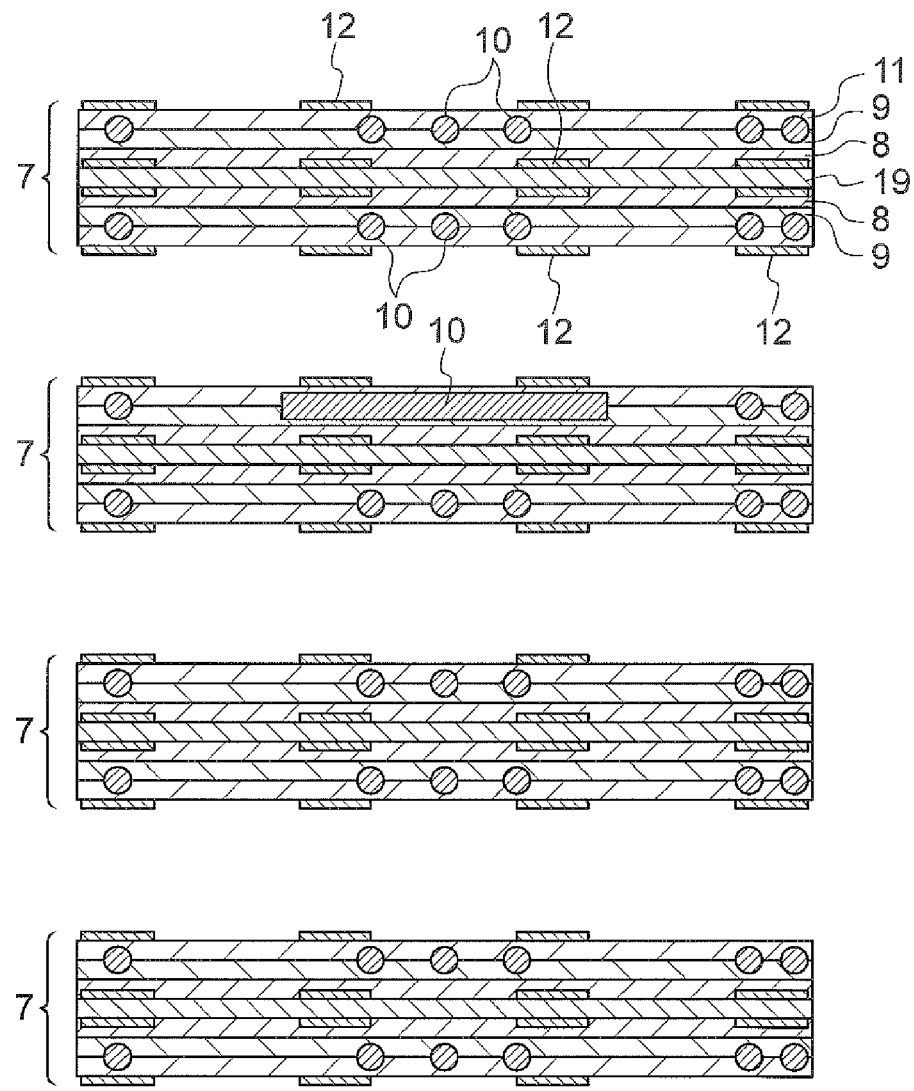
FIG. 3 is a section view illustrating an outline of a structure of a wire wiring layer of the multilayer wiring board in the example 1 of the present invention.

Also, as illustrated in FIG. 3, a circuit was formed on a copper-clad laminate of a polyimide base material 19 (manufactured by Hitachi Chemical Company, Ltd., product name "MCL-I-671") whose plate thickness was 0.1 mm and which had the copper foil of the thickness being 35 μm. Next, an underlay layer 8 was laminated and formed in both front and back surface layers of the polyimide base material 19 by a polyimide prepreg (manufactured by Hitachi Chemical Company, Ltd., product name "GIA-671N"), and an adhesive sheet 9 for wiring was laminated thereon. Then, on the adhesive sheet 9 for wiring, insulated wires (manufactured by Hitachi Chemical Company, Ltd., product name "HAW") that were the insulation coating wires of a wire diameter being 0.08 mm were wired and fixed at the pitch (interval) of 7 mils (1 mil is about 25 μm) in a 1.0 mm pitch as three insulation coating wires 10. Then, a polyimide prepreg (manufactured by Hitachi Chemical Company, Ltd., product name "GIA-671N") to be an overlay 11 and copper foil 12 to be a shield layer were laminated. Then, a circuit was formed at the copper foil 12 to be the shield layer, and four B substrates that were individual wire wiring layers 7 were manufactured. Each B substrate had two layers of the insulation coating wires 10 and four shield layers, and the thickness of the B substrate was 0.6 mm each.

Figure 4:
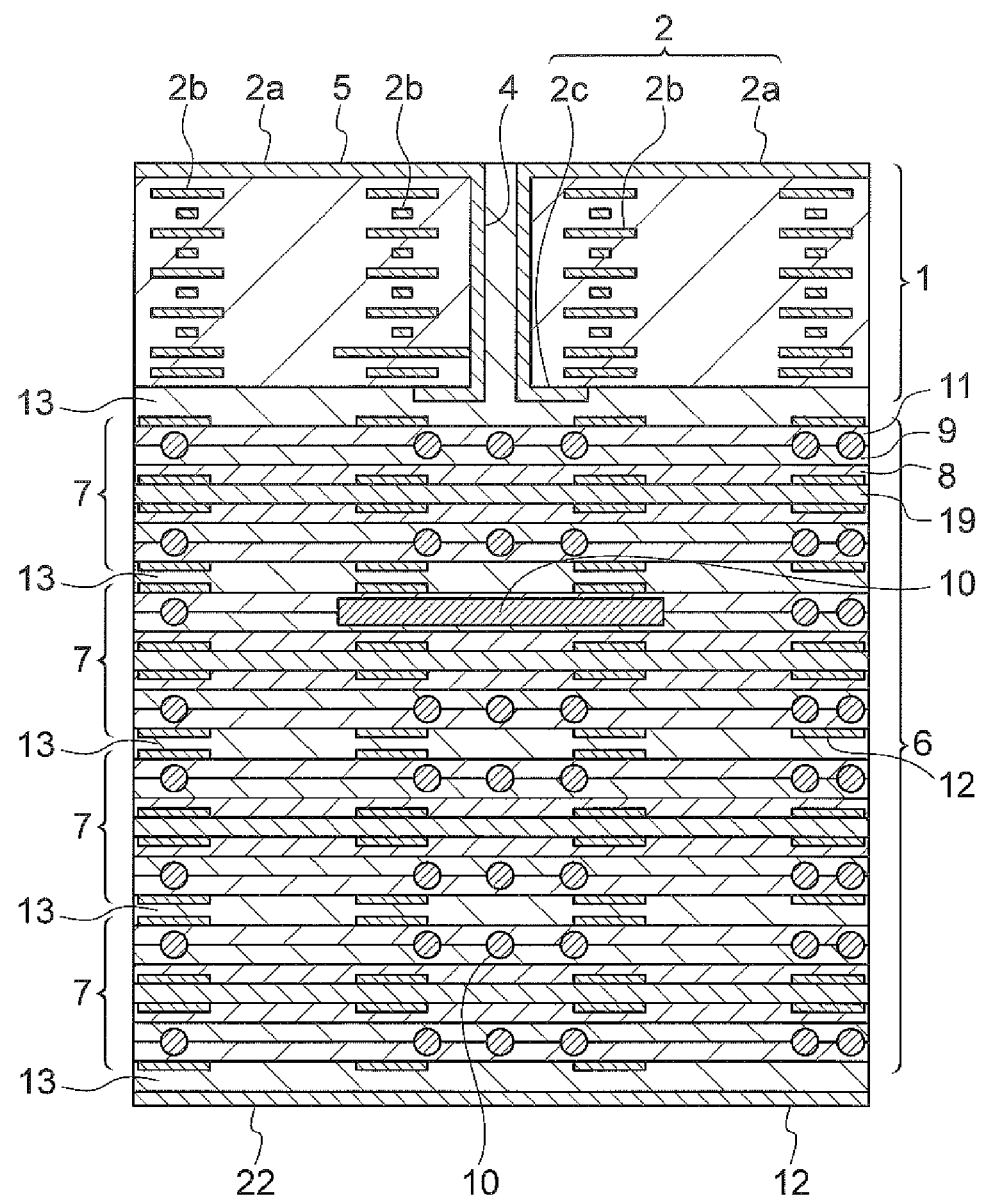
FIG. 4 is a section view illustrating an outline of a structure for which the first metal foil wiring layer and the wire wiring layer of the multilayer wiring board are combined in the example 1 of the present invention.

Then, as illustrated in FIG. 4, one A substrate which was the first metal foil wiring layer 1 and four B substrates which were the individual wire wiring layers 7 were multilayered, bonded and integrated using a polyimide prepreg 13 (manufactured by Hitachi Chemical Company, Ltd., product name "GIA-671N") as the multilayering adhesive layer, and thus, the multilayer wiring board including the first metal foil wiring layer 1 and the wire wiring layer 6 was formed. The thickness of the multilayer wiring board was 3.8 mm.

Subsequently, between a plurality of through-holes (non-through conduction holes 4) at the 1.0 mm pitch formed in the A substrate, through-holes (the small diameter hole part 20 of the through conduction hole) to be connected with the B substrate were formed at the 1.0 mm pitch, shifting in an XY direction by 0.5 mm. Specifically, using a drill of a blade length being 2.8 mm and a diameter being 0.15 mm, drilling work was performed from the surface 5 of the first metal foil wiring layer 1 which was the mounting surface 5 to the depth of 1.4 mm inside the multilayer wiring board.

Figure 5:
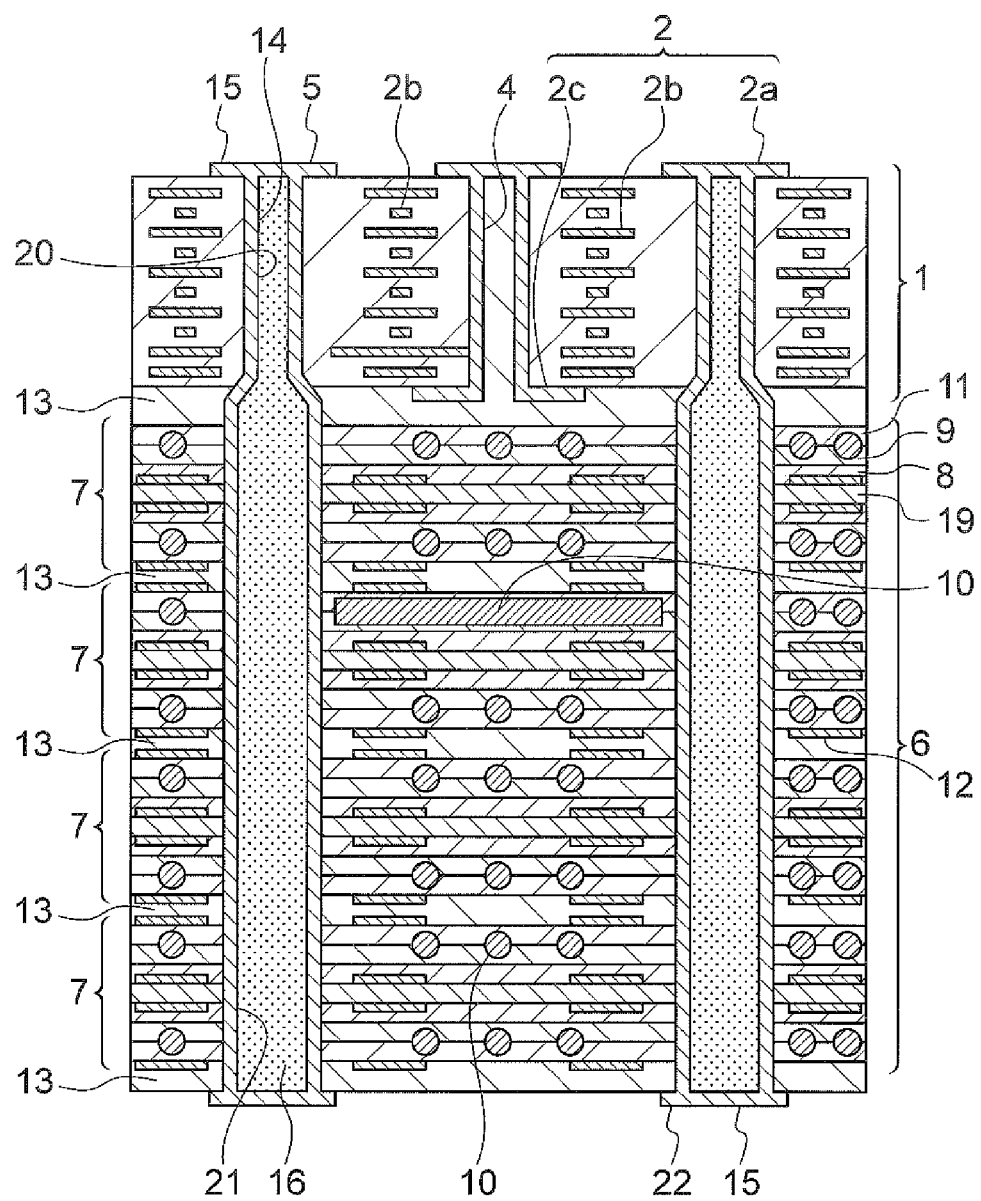
FIG. 5 is a section view illustrating an outline of a structure of the multilayer wiring board in the example 1 of the present invention.

Next, after the multilayer wiring board was inverted and positioned with the metal foil wiring line 2b in the inner layer, so as to penetrate to the a drill hole of the diameter being 0.15 mm drilled from the mounting surface 5 in advance, the drilling work was performed from the surface 22 of the wire wiring layer 6 on the opposite side of the mounting surface 5 to the depth of 2.6 mm inside the multilayer wiring board, using a drill of a blade length being 4.8 mm and a diameter being 0.25 mm. Thus, as illustrated in FIG. 5, a stepped through-hole (the through conduction hole 14 including the small diameter hole part 20 and the large diameter hole part 21) including the drill hole of the diameter being 0.15 mm (the small diameter hole part 20) on the side of the mounting surface 5 and the drill hole of the diameter being 0.25 mm (the large diameter hole part 21) on the opposite side of the mounting surface 5 was formed. Then, the electroless copper plating (thickness is 20 μm) was carried out to the inner peripheral surface of the stepped through-hole, the wire (not shown in the drawing) of the required insulation coating wire 10 and the metal foil wiring line 2b in the inner layer were connected, and the through-hole (the through conduction hole 14) was formed. Then, the through-hole (the through conduction hole 14) was filled with a hole filling resin 16, complete curing was performed, and a lid part 15 was formed by executing lid plating by electroless copper plating (thickness is 15 μm). Also, the metal foil wiring line 2a on the surface of the multilayer wiring board was formed by etching.

Conventionally, in a single body of the metal foil wiring layer (the multilayer wiring board of the metal foil wiring layer only), in the case that the pitch of the interlayer conduction hole is 0.5 mm, a circuit is formed such that the diameter of the interlayer conduction hole is 0.15 mm and a wiring width is 70 μm, and the wiring housing amount is one line between the interlayer conduction holes. Therefore, in the case that the surface mount type component to be mounted is the BGA of a connection terminal pitch being 0.5 mm, depending on the number of the interlayer conduction holes right below the surface mount pad needed for mounting, the board thickness of the multilayer wiring board became too thick in order to obtain a required wiring housing amount. As a result, drill breakage and position deviation tended to occur in the drilling work, and a problem was generated with plating throwing power because of a high aspect ratio (board thickness/hole diameter) in the plating formation. Therefore, need arose to suppress the increase of the board thickness and reduce the wiring housing amount, and it was difficult to cope with the narrow-pitch surface mounting components.

On the other hand, in a single body of the wire wiring layer (a multi-wire wiring board not combined with the metal foil wiring layer), since the drilling work of 0.15 mm almost equal to a wire diameter of the insulation coating wire was needed, there was no tolerance of the wire of the insulation coating wire and drilling work position accuracy, and thus it was difficult to directly mount the surface mount type component for which the connection terminal was at the 0.5 mm pitch on the surface mount pad. In contrast, in the present embodiment, it was made possible to directly mount the surface mount type component for which the connection terminal was at the 0.5 mm pitch on the surface mount pad, and the wiring housing amount could be increased.

As described above, the multilayer wiring board which allowed mounting of the surface mount type component of the 0.5 mm pitch, and for which the wiring housing amount was increased, was formed. For the multilayer wiring board, the first metal foil wiring layer (A substrate) included the interlayer conduction hole at the 0.5 mm pitch arranged right below the surface mount pad and the stepped through-hole (the through conduction hole including the small diameter hole part and the large diameter hole part) of the drill hole of the diameter being 0.15 mm on the side of the mounting surface and the drill hole of the diameter being 0.25 mm on the opposite side of the mounting surface 5, which was one of the interlayer conduction holes, and an inner layer etching circuit layer (the metal foil wiring in the inner layer) was one wiring line between the interlayer conduction holes at the 0.5 mm pitch, the number of the wiring layers was 10 layers (without intersecting of the wiring lines within the same wiring layer), and the board thickness was 0.9 mm. Also, for the wire wiring layer, three insulation coating wires were wired between the interlayer conduction holes at the 1.0 mm pitch, the number of the wiring layers was eight layers (with intersecting of the insulation coating wires within the same wiring layer), and the board thickness was 2.4 mm (the thickness of the individual wire wiring layer was 0.6 mm).

Comparative Example 1

Figure 2:
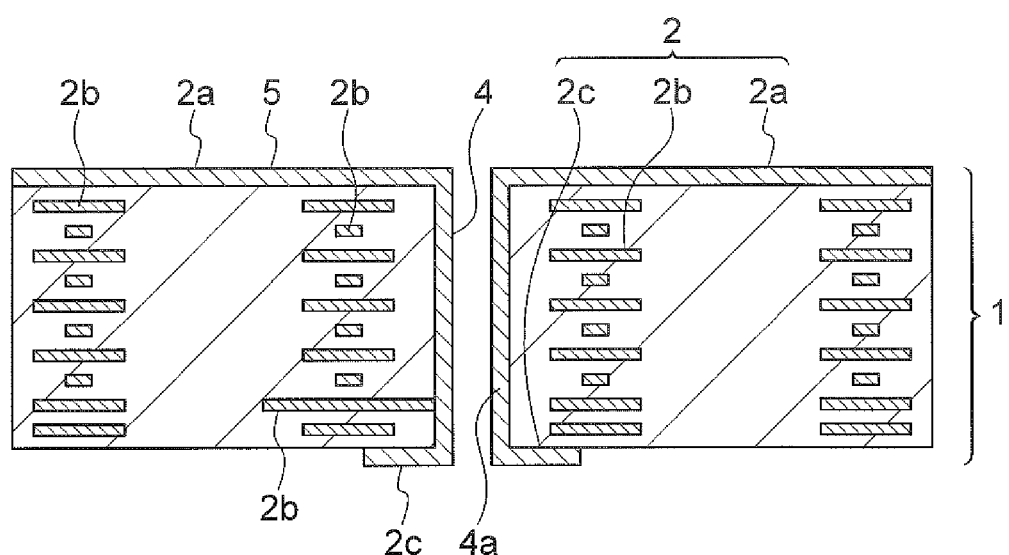
FIG. 2 is a section view illustrating an outline of a structure of a first metal foil wiring layer of the multilayer wiring board in an example 1 of the present invention.

Similarly to the example 1, as illustrated in FIG. 2, one A substrate to be the first metal foil wiring layer 1 was manufactured. The thickness of the A substrate 1 was 0.9 mm.

Then, four metal foil wiring layers designed to have the same wiring housing amount as the individual wire wiring layer (B substrate) of the example 1 were manufactured. Each metal foil wiring layer as the B substrate needed five layers of the metal foil wiring lines and six layers of shields, and the thickness of each was 1.1 mm, being thicker than 0.6 mm of the individual wire wiring layer (B substrate) of the example 1.

Next, similarly to the example 1, one A substrate and the four metal foil wiring layers as the B substrates prepared above were multilayered, bonded and integrated, and the multilayer wiring board having only the metal foil wiring layer was formed. The thickness of the multilayer wiring board was 5.8 mm, and was thick compared to the thickness of the multilayer wiring board in the example 1 being 3.8 mm.

Then, similarly to the example 1, between the through-holes (non-through conduction holes) at the 1.0 mm pitch formed in the A substrate 1, the through-holes (the small diameter hole part of the through conduction hole) were formed at the 1.0 mm pitch, shifting in the XY direction by 0.5 mm. Specifically, using the drill of the blade length being 2.8 mm and the diameter being 0.15 mm, the drilling work was performed from the surface of the first metal foil wiring layer (A substrate) which is the mounting surface to the depth of 1.4 mm inside the multilayer wiring board.

Next, after the multilayer wiring board was inverted and positioned with the metal foil wiring line in the inner layer, so as to penetrate to the drill hole of the diameter being 0.15 mm drilled from the mounting surface in advance, the drilling work was performed from the surface on the opposite side of the mounting surface to the depth of 4.6 mm inside the multilayer wiring board, using the drill of the blade length being 4.8 mm and the diameter being 0.25 mm. Thus, the stepped through-hole (the through conduction hole including the small diameter hole part and the large diameter hole part) including the drill hole of the diameter being 0.15 mm (the small diameter hole part) on the mounting surface side and the drill hole of the diameter being 0.25 mm (the large diameter hole part) on the opposite side of the mounting surface was formed. Thereafter, similarly to the example 1, the multilayer wiring board was manufactured.

For this multilayer wiring board, drill breakage and position deviation occurred in the drilling work, and the plating throwing power was inferior because of the high aspect ratio (board thickness/hole diameter) in the plating formation. Therefore, it was needed to reduce the wiring housing amount, and it was difficult to cope with the narrow-pitch surface mount type components.

Comparative Example 2

One wire wiring layer designed to be the same wiring housing amount as the first metal foil wiring layer (A substrate) in the example 1 was manufactured. Also, similarly to the example 1, the drilling work was performed with the drill of the diameter being 0.15 mm at the 1.0 mm pitch, and connection was carried out with the inner layer pattern (the insulation coating wire in the inner layer) needed as the electroless copper plating (thickness is 20 μm). There were two layers of the insulation coating wires and four shield layers of the wire wiring layer as this A substrate and, and the plate thickness was 0.6 mm.

Next, similarly to the example 1, the wire wiring layer (B substrate) was manufactured, the wire wiring layer as the A substrate prepared above was multilayered, bonded and integrated, and the multilayer wiring board having only the wire wiring layer was formed. The thickness of the multilayer wiring board was 3.5 mm, and was thin compared to the multilayer wiring board in the example 1.

Then, similarly to the example 1, between the through-holes (non-through conduction holes) at the 1.0 mm pitch formed in the wire wiring layer as the A substrate, the through-holes (the small diameter hole part of the through conduction hole) were formed at the 1.0 mm pitch, shifting in the XY direction by 0.5 mm. Specifically, using the drill of the blade length being 2.8 mm and the diameter being 0.15 mm, the drilling work was performed from the surface of the wire wiring layer as the A substrate which is the mounting surface to the depth of 1.4 mm inside the multilayer wiring board.

Next, after the multilayer wiring board was inverted and positioned with the insulation coating wire in the inner layer, so as to penetrate to the drill hole of the diameter being 0.15 mm drilled from the mounting surface in advance, the drilling work was performed from the surface on the opposite side of the mounting surface to the depth of 2.3 mm inside the multilayer wiring board, using the drill of the blade length being 4.8 mm and the diameter being 0.25 mm. Thus, the stepped through-hole (the through conduction hole including the small diameter hole part and the large diameter hole part) including the drill hole of the diameter being 0.15 mm (the small diameter hole part) on the mounting surface side and the drill hole of the diameter being 0.25 mm (the large diameter hole part) on the opposite side of the mounting surface was formed. Thereafter, similarly to the example 1, the multilayer wiring board was manufactured.

For this multilayer wiring board, since the interlayer conduction hole was at the 0.5 mm pitch and the drill diameter was the small diameter of 0.15 mm, with respect to the wire diameter of the insulation coating wire being 0.08 mm, positioning when drilling the through conduction hole was difficult, and connection reliability of the through-hole plating and the wire could not be secured. Therefore, by the wire wiring layer single body, it was difficult to cope with the interlayer conduction hole pitch of 0.5 mm.

Comparative Example 3

Similarly to the example 1, one A substrate to be the first metal foil wiring layer was manufactured. The thickness of the A substrate was 0.9 mm. Then, similarly to the example 1, four B substrates which were the individual wire wiring layers were manufactured. The thickness of the B substrate was 0.6 mm each. Next, similarly to the example, one A substrate and four B substrates were multilayered, bonded and integrated, and the multilayer wiring board including the first metal foil wiring layer and the wire wiring layer was formed. The thickness of the multilayer wiring board was 3.8 mm.

Then, similarly to the example 1, between the through-holes (non-through conduction holes) at the 1.0 mm pitch formed in the A substrate, the through-holes (the small diameter hole part of the through conduction hole) for connection with the B substrate were drilled at the 1.0 mm pitch, shifting in the XY direction by 0.5 mm, from the surface of the first metal foil wiring layer which was the mounting surface to 2.0 mm inside the multilayer wiring board, with the drill of the blade length being 2.8 mm and the diameter being 0.15 mm.

Next, after the multilayer wiring board was inverted and positioned with the metal foil wiring line in the inner layer, so as to penetrate to the drill hole of the diameter being 0.15 mm drilled from the mounting surface in advance, the drilling work was performed from the surface of the wire wiring layer on the opposite side of the mounting surface to the position of 2.0 mm inside the multilayer wiring board, using the drill of the blade length being 4.8 mm and the diameter being 0.15 mm. That is, differently from the example 1, the diameter of the drill used for drilling from the surface of the first metal foil wiring layer which is the mounting surface was the same as the diameter of the drill used for drilling from the surface of the wire wiring layer 6 on the opposite side of the mounting surface. Thus, a straight through-hole (the through conduction hole) including the drill hole of the diameter being 0.15 mm from the mounting surface side to the opposite side of the mounting surface was formed. Thereafter, similarly to the example 1, the multilayer wiring board was manufactured.

For this multilayer wiring board, the drill breakage and the position deviation occurred in the drilling work, and the plating throwing power was inferior because of the high aspect ratio (board thickness/hole diameter) in the plating formation. Therefore, it was needed to reduce the wiring housing amount, and it was difficult to cope with the narrow-pitch surface mounting components.

Example 2

Figure 7:
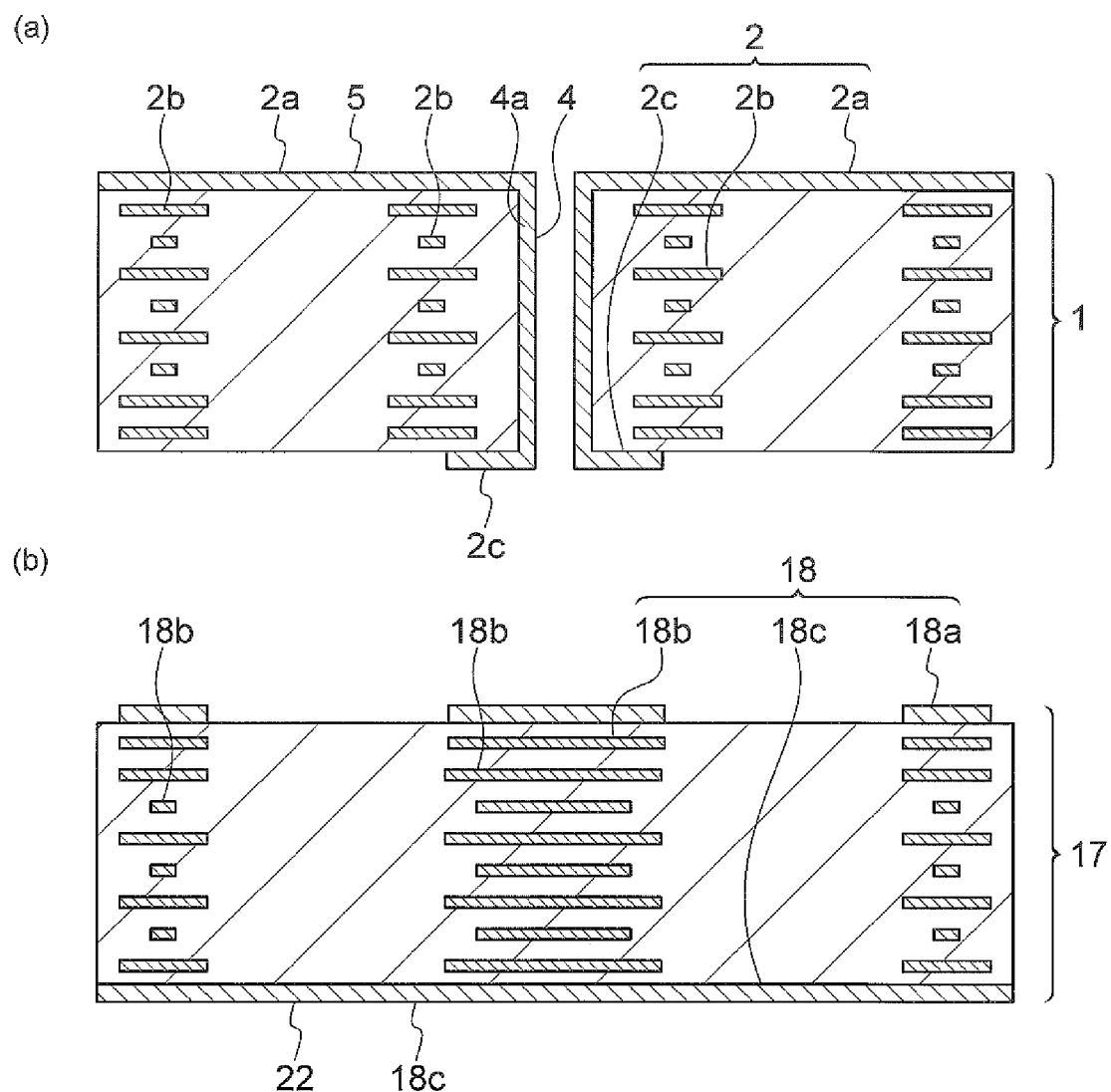
FIG. 7 is a section view illustrating an outline of a structure of the metal foil wiring layer of the multilayer wiring board in an example 2 of the present invention, (a) illustrates an outline of the structure of the first metal foil wiring layer, and (b) illustrates an outline of the structure of a second metal foil wiring layer.

Next, using FIG. 7-FIG. 9, the example 2 of the multilayer wiring board of the present invention will be described. FIG. 7(a) is a section view illustrating an outline of the first metal foil wiring layer 1 arranged on the side of the mounting surface 5 of the multilayer wiring board in the example 2 of the present invention. The first metal foil wiring layer 1 was manufactured as follows. First, on the copper-clad laminate of the polyimide base material (manufactured by Hitachi Chemical Company, Ltd., product name "MCL-I-671") whose plate thickness is 0.06 mm and which uses the copper foil of the thickness being 18 μm, a circuit (metal foil wiring line 2) for which the line width was 70 μm and which had one wiring line at the 0.5 mm pitch, was formed. The plurality of such polyimide base materials were formed. Then, using the polyimide prepreg (manufactured by Hitachi Chemical Company, Ltd., product name "GIA-671N") as the multilayering adhesive layer, the polyimide base materials were multilayered and laminated, and the first metal foil wiring layer 1 whose plate thickness was 0.9 mm and which had eight layers of the metal foil wiring lines 2b as the inner layer was formed.

Then, the drilling work was carried out using the drill of the diameter being 0.15 mm at the 1.0 mm pitch to the multilayered polyimide base material, the electroless copper plating (thickness was 20 μm) was executed to the inner peripheral surface of the hole (interlayer conduction hole 4) of the multilayered base material, and the copper foil (metal foil wiring line 2a) on the base material surface and the required inner layer pattern (the metal foil wiring line 2b in the inner layer) were connected through the conduction part 4a formed on the inner peripheral surface of the hole. Also, the circuit (metal foil wiring line 2c) of the copper foil was formed in the surface layer to be the surface opposite to the surface mounting surface 5 of the multilayered base material, and the copper foil circuit was also connected to the conduction part 4a. Thus, one A substrate to be the first metal foil wiring layer 1 was manufactured.

FIG. 7(b) is a section view illustrating an outline of the second metal foil wiring layer 17 arranged on the opposite side of the mounting surface 5 of the multilayer wiring board in the example 2. The second metal foil wiring layer 17 was manufactured as follows. First, on the copper-clad laminate of the polyimide base material (manufactured by Hitachi Chemical Company, Ltd., product name "MCL-I-671") whose plate thickness was 0.06 mm and which uses the copper foil of the thickness being 18 μm, a circuit (metal foil wiring line 18) for which the line width was 70 μm and which had one wiring line at the 0.5 mm pitch was formed. Then, multilayering and lamination were carried out using the polyimide prepreg (manufactured by Hitachi Chemical Company, Ltd., product name "GIA-671N") as the multilayering adhesive layer, and the second metal foil wiring layer 17 whose plate thickness was 0.6 mm and which had eight layers of the metal foil wiring lines 18b as the inner layer was formed. Then, the circuit was formed at the surface layer (metal foil wiring line 18c) to be laminated with the wire wiring layer 6, and a C substrate to be the second metal foil wiring layer 17 was manufactured.

In the meantime, the wire wiring layer 6 in the multilayer wiring board illustrated in FIG. 8 was manufactured as follows. First, a circuit was formed on the copper-clad laminate of the polyimide base material 19 whose plate thickness was 0.1 mm and which used the copper foil of the thickness being 35 μm, the underlay layer 8 was laminated and formed by the polyimide prepreg (manufactured by Hitachi Chemical Company, Ltd., product name "GIA-671N"), and the adhesive sheet 9 for wiring was laminated. Then, on the adhesive sheet 9 for wiring, insulated wires (manufactured by Hitachi Chemical Company, Ltd., product name "HAW") that are the insulation coating wires of the wire diameter being 0.08 mm were wired and fixed at the pitch (interval) of 7 mils (1 mil is about 25 μm) in a 1.0 mm pitch as three insulation coating wires 10. Then, the polyimide prepreg (manufactured by Hitachi Chemical Company, Ltd., product name "GIA-671N") to be the overlay 11 and copper foil 12 to be the shield layer were laminated. Then, a circuit was formed at the copper foil 12 to be the shield layer, and three B substrates that were individual wire wiring layers 7 were manufactured. Each B substrate had two layers of the insulation coating wires 10 and two shield layers, and the thickness of the B substrate was 0.6 mm each.

Figure 8:
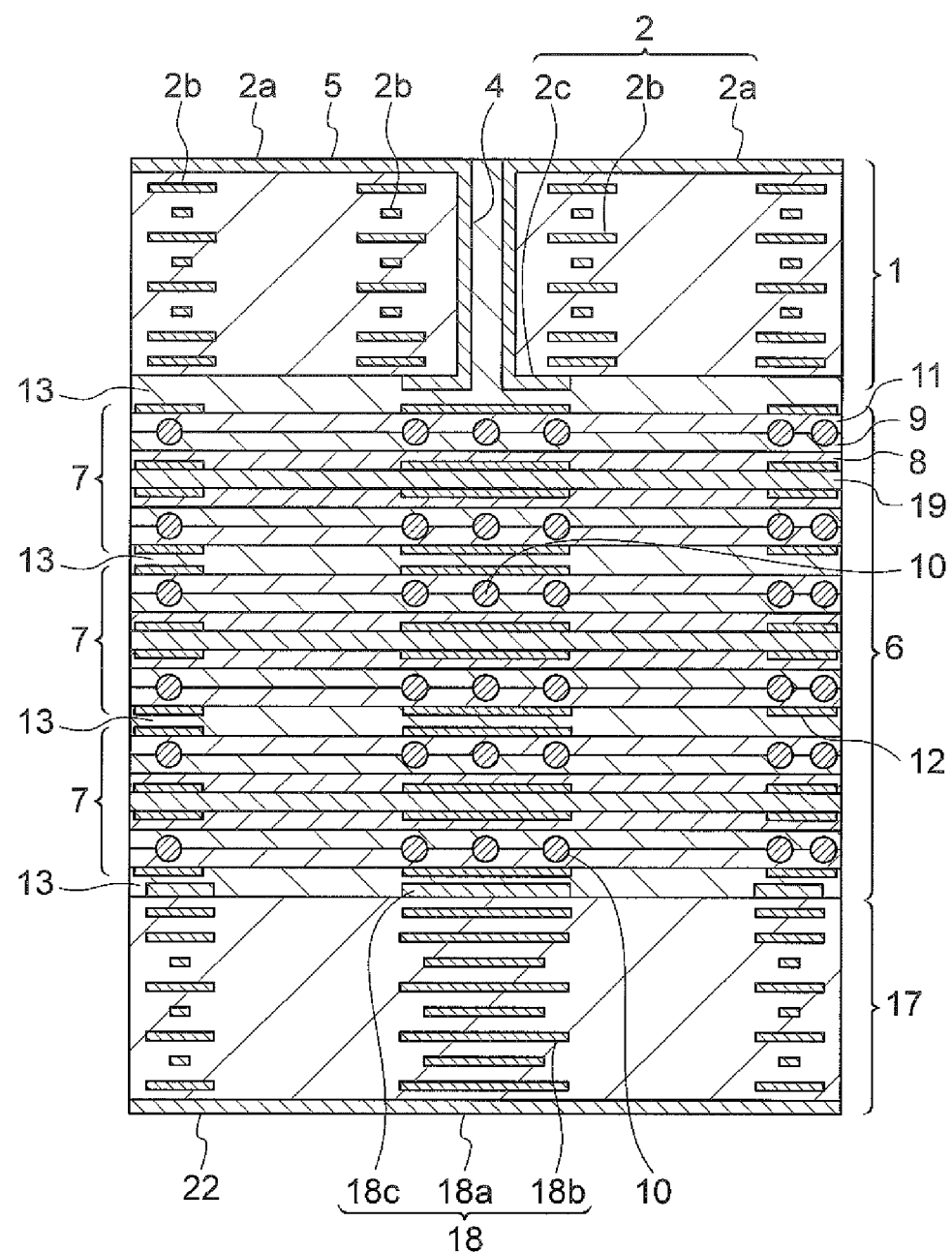
FIG. 8 is a section view illustrating an outline of a structure for which the first and second metal foil wiring layers and the wire wiring layer of the multilayer wiring board are combined in the example 2 of the present invention.

Then, as illustrated in FIG. 8, one A substrate which was the first metal foil wiring layer 1, three B substrates which were the individual wire wiring layers 7, and one C substrate which was the second metal foil wiring layer 17 were multilayered, bonded and integrated using the polyimide prepreg (manufactured by Hitachi Chemical Company, Ltd., product name "GIA-671N") as the multilayering adhesive layer 13, and the multilayer wiring board including the first metal foil wiring layer 1 and the wire wiring layer 6 and the multilayer wiring board including the second metal foil wiring layer 17 were formed. The thickness of the multilayer wiring board was 3.8 mm.

Figure 9:
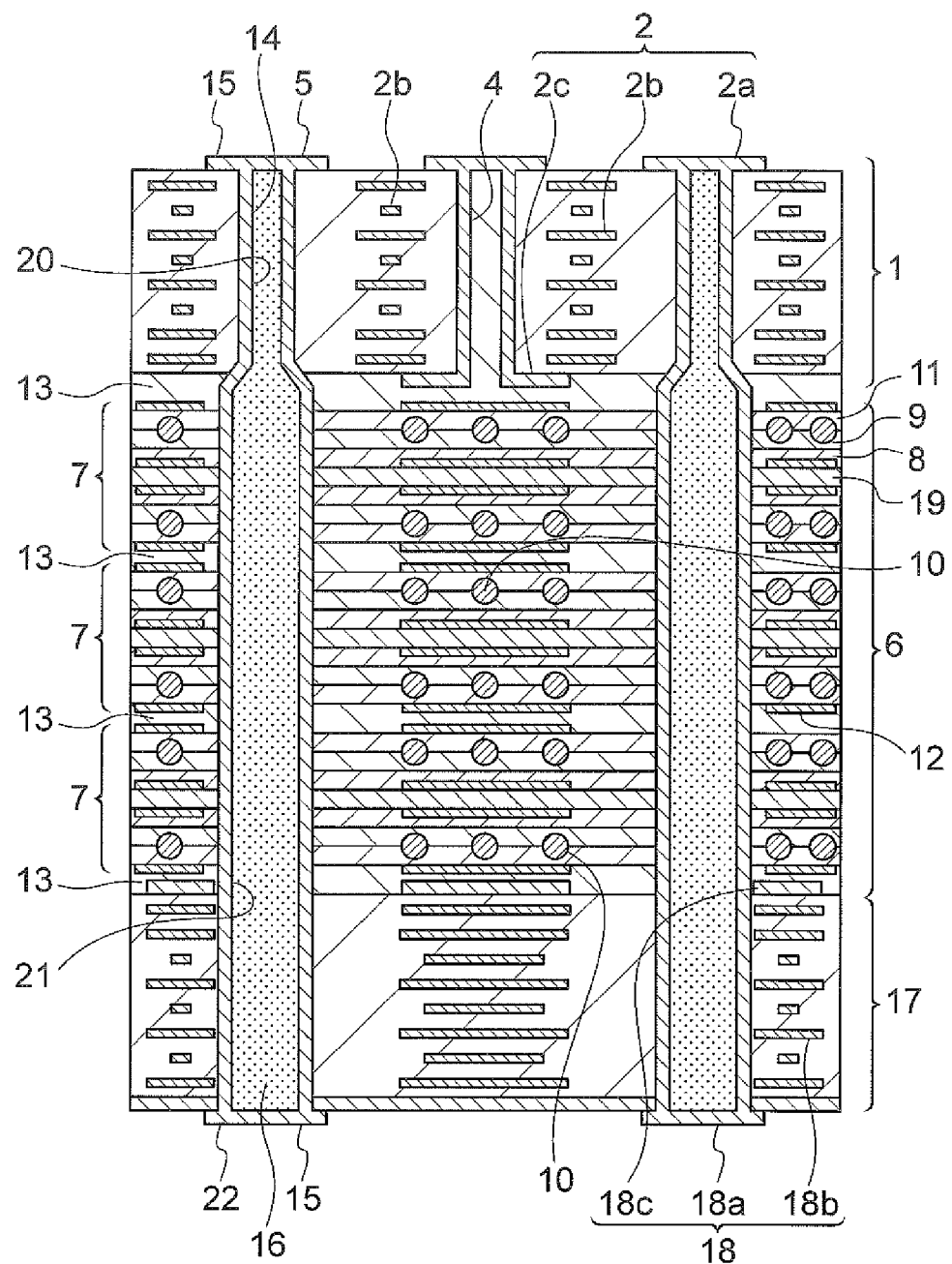
FIG. 9 is a section view illustrating an outline of the structure of the multilayer wiring board in the example 2 of the present invention.

Next, as illustrated in FIG. 9, between the through-holes (non-through conduction holes 4) at the 1.0 mm pitch formed in the A substrate, the through-holes (the small diameter hole part 20 of the through conduction hole 14) for connection with the B substrate were formed at the 1.0 mm pitch, shifting in the XY direction by 0.5 mm. Specifically, using the drill of the blade length being 2.8 mm and the diameter being 0.15 mm, the drilling work was performed from the surface 5 of the first metal foil wiring layer 1 which was the mounting surface to the depth of 1.4 mm inside the multilayer wiring board.

Then, after the multilayer wiring board was inverted and positioned with the metal foil wiring line 2b in the inner layer, so as to penetrate to the drill hole of the diameter being 0.15 mm drilled from the mounting surface 5 in advance, the drilling work was performed from the surface 22 of the second metal foil wiring layer 17 on the opposite side of the mounting surface to the depth of 2.6 mm inside the multilayer wiring board, using the drill of the blade length being 4.8 mm and the diameter being 0.25 mm. Thus, the stepped through-hole (the through conduction hole 14 including the small diameter hole part 20 and the large diameter hole part 21) including the drill hole of the diameter being 0.15 mm (the small diameter hole part 20) on the mounting surface side and the drill hole of the diameter being 0.25 mm (the large diameter hole part 21) on the opposite side of the mounting surface is formed. Then, the electroless copper plating (the thickness was 20 μm) was carried out to the inner peripheral surface of the stepped through-hole, the wire (not shown in the drawing) of the required insulation coating wire 10 and the metal foil wiring line 2b in the inner layer were connected, and the through-hole (the through conduction hole 14) was formed. Then, the through-hole (the through conduction hole 14) was filled with the hole filling resin 16, complete curing is performed, and the lid part 15 was formed by executing the lid plating by the electroless copper plating (the thickness was 15 μm). Also, the metal foil wiring lines 2a and 18c on the surface were formed by etching.

In the multilayer wiring board for which the first metal foil wiring layer and the wire wiring layer were laminated and integrated in the example 1, since a layer configuration in the board thickness direction was not a symmetrical structure, slight warp was generated (in a size of 500 mm long and 500 mm wide, an average value of a warp amount measured for 24 boards was 0.6 mm). In contrast, in the example 2, the first metal foil wiring layer 1, the wire wiring layer 6 and the second metal foil wiring layer 17 were laminated and integrated for the multilayer wiring board, and since the layer configuration in the board thickness direction became the symmetrical structure, the warp was suppressed (in the size of 500 mm long and 500 mm wide, the average value of the warp amount measured for 24 boards was 0.3 mm). Thus, in the multilayer wiring board in the example 2, manufacturing of the multilayer wiring board and 0.5 mm pitch component mounting could be carried out more easily than in the example 1. Also, the warp amount was measured, when the multilayer wiring board was placed on a surface plate turning a projected surface side to the surface plate, by measuring a clearance of four corners and the surface plate by a clearance gauge, with the maximum value as the warp amount.

As described above, the multilayer wiring board which allowed the mounting of the surface mount type component at the 0.5 mm pitch, and for which the wiring housing amount was increased and the warp was suppressed further was formed. For the multilayer wiring board, the first metal foil wiring layer (A substrate) included the interlayer conduction hole at the 0.5 mm pitch arranged right below the surface mount pad and the stepped through-hole (the through conduction hole including the small diameter hole part and the large diameter hole part) of the drill hole of the diameter being 0.15 mm on the mounting surface side and the drill hole of the diameter being 0.25 mm on the opposite side of the mounting surface, which is one of the interlayer conduction holes, and the inner layer etching circuit layer (the metal foil wiring in the inner layer) was one wiring line between the interlayer conduction holes at the 0.5 mm pitch, the number of the wiring layers was 10 layers (without intersecting of the wiring lines within the same wiring layer), and the board thickness was 3.8 mm. Also, for the wire wiring layer, three insulation coating wires were wired between the interlayer conduction holes at the 1.0 mm pitch, and the number of the wiring layers was six layers (with intersecting of the insulation coating wires within the same wiring layer).

INDUSTRIAL APPLICABILITY

The present invention is applicable to the multilayer wiring board, the multilayer wiring board for mounting surface mount type components in particular.

REFERENCE SIGNS LIST

1 . . . First metal foil wiring layer, 2, 2a-2c . . . Metal foil wiring line, 4 . . . Non-through conduction hole, 4a, 14a . . . Conductor part, 5 . . . Mounting surface, 6 . . . Wire wiring layer, 8 . . . Underlay layer (prepreg layer), 10 . . . Insulation coating wire, 11 . . . Overlay layer (prepreg layer), 13 . . . Multilayering adhesive layer (prepreg layer), 14 . . . Through conduction hole, 17 . . . Second metal foil wiring layer, 18, 18a-18c . . . Metal foil wiring lines, 20 . . . Small diameter hole part, 21 . . . Large diameter hole part.

The invention claimed is:
1. A multilayer wiring board comprising:
a first metal foil wiring layer that has at least two or more layers of metal foil wiring lines, including a metal foil wiring line positioned on a surface of the first metal foil wiring layer and a plurality of metal foil wiring lines in an inner layer of the first metal foil wiring layer, and is arranged on a mounting surface side for mounting a surface mount type component;

a wire wiring layer that is arranged on an opposite side of the mounting surface, and in which an insulation coating wire is wired; and a first interlayer conduction hole that has a conduction part which electrically connects the metal foil wiring line positioned on a surface of the first metal foil wiring layer to at least one of the metal foil wiring lines in an inner layer of the first metal foil wiring layer and the insulation coating wire of the wire wiring layer, wherein a hole diameter of the first interlayer conduction hole varies in a board thickness direction of the multilayer wiring board.

2. The multilayer wiring board according to claim 1, wherein the first interlayer conduction hole includes a small diameter hole part that is positioned on the first metal foil wiring layer side of the multilayer wiring board, and a large diameter hole part that is positioned on the wire wiring layer side and has a hole diameter larger than the small diameter hole part.

3. The multilayer wiring board according to claim 1, further comprising a second interlayer conduction hole that is positioned on the first metal foil wiring layer side and is formed at a position different from the first interlayer conduction hole, wherein the first interlayer conduction hole is a through conduction hole passing through the multilayer wiring board, and the second interlayer conduction hole is a non-through conduction hole not passing through the multilayer wiring board.

4. The multilayer wiring board according to claim 3, wherein a plurality of second interlayer conduction holes are provided and a plurality of the first interlayer conduction holes are provided, and wherein the first interlayer conduction holes and the second interlayer conduction holes are alternately arranged.

5. The multilayer wiring board according to claim 3, wherein a plurality of insulation coating wires are provided in the wire wiring layer, and wherein the number of the metal foil wiring lines arranged in a gap of the first and second interlayer conduction holes and the number of the insulation coating wires arranged in a gap of the first interlayer conduction holes with each other are different.

6. The multilayer wiring board according to claim 3, wherein a plurality of the first interlayer conduction holes are provided, and wherein a width of the metal foil wiring line arranged in the gap of the first and second interlayer conduction holes and a diameter of the insulation coating wire arranged in the gap of the first interlayer conduction holes with each other are different.

7. The multilayer wiring board according to claim 1, further comprising a second metal foil wiring layer that is arranged on the opposite side of the mounting surface side of the wire wiring layer and has at least two or more layers of metal foil wiring lines.

8. The multilayer wiring board according to claim 7, wherein a prepreg used for multilayering adhesion of the first metal foil wiring layer arranged on the mounting surface side of the wire wiring layer and a prepreg used for multilayering adhesion of the second metal foil wiring layer are different kinds.

9. The multilayer wiring board according to claim 1, wherein the wire wiring layer includes a plurality of insulation coating wires wired in a spreading direction of the wire wiring layer.

10. The multilayer wiring board according to claim 1, wherein the wire wiring layer includes a plurality of intersecting insulation coating wires wired in a spreading direction of the wire wiring layer wiring pattern.

* * * * *